United States Patent [19]
Asano

[11] Patent Number: 5,652,452
[45] Date of Patent: Jul. 29, 1997

[54] SEMICONDUCTOR DEVICE WITH PLURALITIES OF GATE ELECTRODES

[75] Inventor: Kazunori Asano, Tokyo, Japan

[73] Assignee: NEC Corporation, Japan

[21] Appl. No.: 595,824

[22] Filed: Feb. 2, 1996

[30] Foreign Application Priority Data

Feb. 6, 1995 [JP] Japan .................................. 7-041373

[51] Int. Cl.⁶ .................................................. H01L 29/76
[52] U.S. Cl. ...................... 257/341; 257/365; 257/366; 257/401
[58] Field of Search ............................. 257/401, 341, 257/365, 366

[56] References Cited

U.S. PATENT DOCUMENTS

| | | | |
|---|---|---|---|
| 3,586,930 | 6/1971 | Das et al. | 257/401 |
| 4,462,041 | 7/1984 | Glenn | 257/401 |
| 5,321,291 | 6/1994 | Redwine | 257/401 X |
| 5,321,292 | 6/1994 | Gongwer | 257/401 X |
| 5,528,056 | 6/1996 | Shimada et al. | 257/401 X |
| 5,528,065 | 6/1996 | Bahersby et al. | 257/401 X |
| 5,563,439 | 10/1996 | Chung et al. | 257/365 |

FOREIGN PATENT DOCUMENTS

| | | |
|---|---|---|
| 0373803 | 6/1990 | European Pat. Off. . |
| 57-160148 | 10/1982 | Japan . |
| 63-150966 | 6/1988 | Japan .................................. 257/401 |
| 6151843 | 5/1994 | Japan .................................. 257/401 |

OTHER PUBLICATIONS

"GaAs Microwave Power FET"; Fukuta et al; IEEE Transactions on Electron Devices, vol. ED-23, o. 4, Apr. 1976; pp. 388-394.

*Primary Examiner*—William Mintel
*Attorney, Agent, or Firm*—Hayes, Soloway, Hennessey, Grossman & Hage, P.C.

[57] ABSTRACT

A semiconductor device has a structure in which pluralities of gate electrodes, drain electrodes, and source electrodes extend in parallel to each another. The semiconductor device includes at least one isolation area formed in a direction perpendicular to at least one gate electrode so as to separate one active layer area formed on a semiconductor substrate into a plurality of active layer areas. The at least one gate electrode is connected to each of the plurality of active layer areas separated by the at least one isolation area.

9 Claims, 7 Drawing Sheets

SEMICONDUCTOR DEVICE WITH PLURALITIES OF GATE ELECTRODES

BACKGROUND OF THE INVENTION

1. Field of the Invention

The present invention relates to a semiconductor device and, more particularly, to a high-output, high-frequency GaAs field effect transistor (FET).

2. Description of the Prior Art

To increase output from a high-output FET, its gate width must be increased. For this purpose, a comb-shaped gate structure (inter-digital structure) in which gate fingers are formed parallel to each other is employed. In particular, a PHS (Plated Heat Sink) structure is employed in which a thin chip is used, and a thick metal layer is formed on the lower surface of the chip in order to cope with an increase in amount of heat generated as a result of increase in output from the element or device. In this structure, however, warping of the chip poses a problem.

FIG. 1 is a plan view showing conventional high-output FETs. In the structure shown in FIG. 1, pluralities of gate electrodes 2, source electrodes 3, and drain electrodes 4 are alternately aligned in parallel with one another on an active layer area 1 of the semiconductor device.

Although it is effective to increase the number of fingers in this manner so as to increase the device output, too great and increase in their number increases the chip width, which, in turn, reduces the mechanical strength of the chip. In addition, chip warpage increases due to influence of heat in mounting. For this reason, unit finger length must be increased to achieve high output.

In the prior art, as shown in FIG. 1, the active layer area 1 is uniformly formed with respect to the gate fingers.

Although it is effective to increase the number of fingers as described above so as to increase the device output, the package capacitance undesirably increases, or the chip undesirably warps during assembling. In consideration of these problems, to achieve a high output, the unit finger length may be increased.

Warping of the chip originates from the PHS (Plated Heat Sink) structure in which a thin chip is used, and a thick metal layer is formed on the lower surface of the chip in order to cope with an increase in amount of heat generated as a result of increase in output from the element. That is, since the chip is thin, the chip warps even at room temperature due to the stress incurred by formation of the thick metal layer on the lower surface of the chip. When heat is applied in die bonding, the chip further warps, resulting in chip warpage. The stress of the warpage remains on the chip substrate, posing problems in reliability (e.g., the chip may crack in service due to a thermal shock upon an ON/OFF operation and may break in the worst case).

If the finger length is simply elongated, the decrement in thermal resistance with respect to a given DC power to be supplied becomes small, resulting in an increase in channel temperature.

FIG. 2 shows the relationship between a gate finger length L (μm), a thermal resistance Rθ (° C./W), and an increment ΔT (°C.) in channel temperature. In FIG. 2, the finger length L (μm) is plotted along the abscissa, and the thermal resistance Rθ (°C./W) and the increment ΔT (°C.) in channel temperature are plotted along the left and right sides of the ordinate, respectively.

FIG. 2 shows the thermal resistance Rθ obtained when the finger length is changed in a comb-shaped gate structure having 96 fingers, and the increment (αT) in channel temperature obtained when a DC power proportional to the gate width at that time is supplied. Note that the DC power is 1 W per unit gate width.

As for the relationship between the finger length L (μm) and the thermal resistance Rθ (°C./W) on the left side of the ordinate shown in FIG. 2, the thermal resistance can be reduced by increasing the finger length so as to increase the gate width. However, after the finger length reaches a certain value, the thermal resistance begins to decrease non-linearly.

On the other hand, in the relationship between the finger length L (μm) and ΔT (°C.) on the right side of the ordinate, an increase in finger length L increases ΔT (°C.). That is, when a DC power proportional to the gate width is supplied, ΔT undesirably increases with an increase in finger length L, resulting in high channel temperature

SUMMARY OF THE INVENTION

The present invention has been made in consideration of the above situation, and has as its object to provide a semiconductor device in which an increase in channel temperature can be suppressed even when the gate finger is elongated to expand the gate width.

To achieve the above object, according to the basic aspect of the present invention, there is provided a semiconductor device having a structure in which pluralities of gate electrodes, drain electrodes, and source electrodes are alternately arranged in parallel with one another, comprising an isolation area formed in a direction perpendicular to the gate electrode so as to divide an active layer area formed on a semiconductor substrate into a plurality of active layer areas.

In the basic aspect of the present invention, the isolation area is formed at, at least, one portion or at a plurality of portions between one and the other terminals of each electrode.

Further, in the basic aspect of the present invention, the isolation area has a width approximately twice a thickness of the semiconductor substrate.

In the structure of the present invention having the above aspects, the active layer area is divided into a plurality of parts by the isolation area formed in the direction perpendicular to the gate electrodes. When this structure is used in a high-output FET having a comb-shaped gate structure in which gate fingers are formed parallel to each other, its output can be increased while the thermal resistance is reduced, and the channel temperature does not increase. More specifically, in an element having a comb-shaped gate structure in which a plurality of unit FETs are aligned parallel to each other, since the active layer area is divided into a plurality of parts by the isolation area formed in the direction perpendicular to the gate fingers, the heat diffusion path can be widened, thereby reducing an thermal resistance, and suppressing an increase in channel temperature. In addition, even when the gate finger is elongated, and gate width is expanded in the high-output FET, increase in channel temperature can be suppressed.

The above and many other advantages, features and additional objects of the present invention will become manifest to those versed in the art upon making reference to the following detailed description and accompanying drawings in which preferred structural embodiments incorporating the principles of the present invention are shown by way of illustrative example.

DETAILED DESCRIPTION OF PREFERRED EMBODIMENTS

Preferred embodiments of the present invention will be described below with reference to the accompanying drawings.

Figure 1:
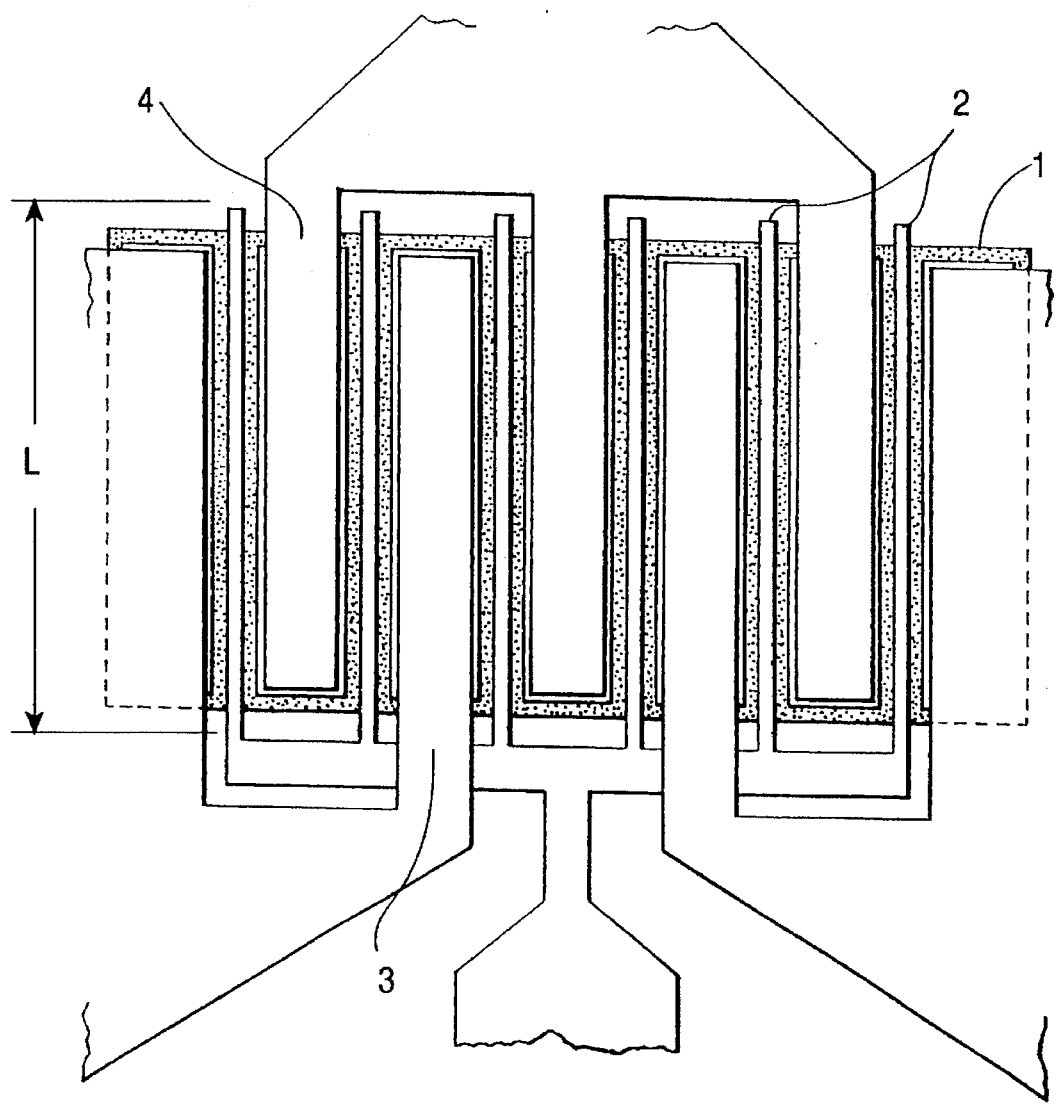
FIG. 1 is a plan view showing an example of a conventional semiconductor device.
Figure 2:
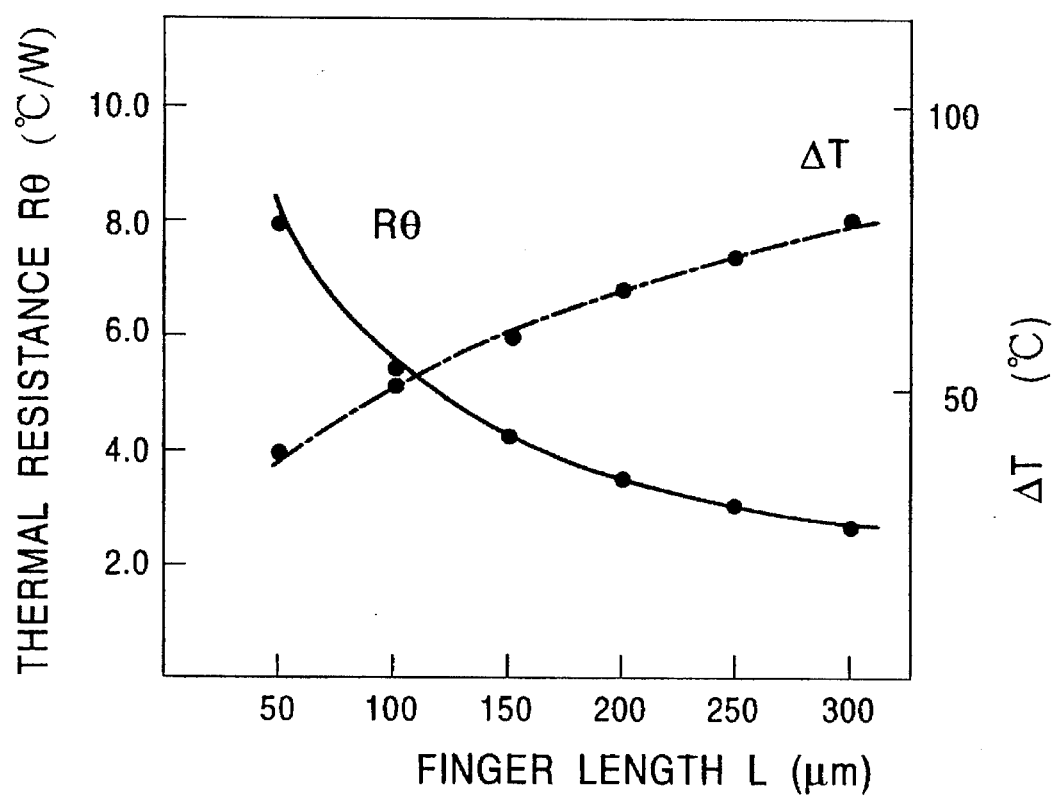
FIG. 2 is a graph showing the relationship between the gate finger length, the thermal resistance, and the increasing in channel temperature.
Figure 3:
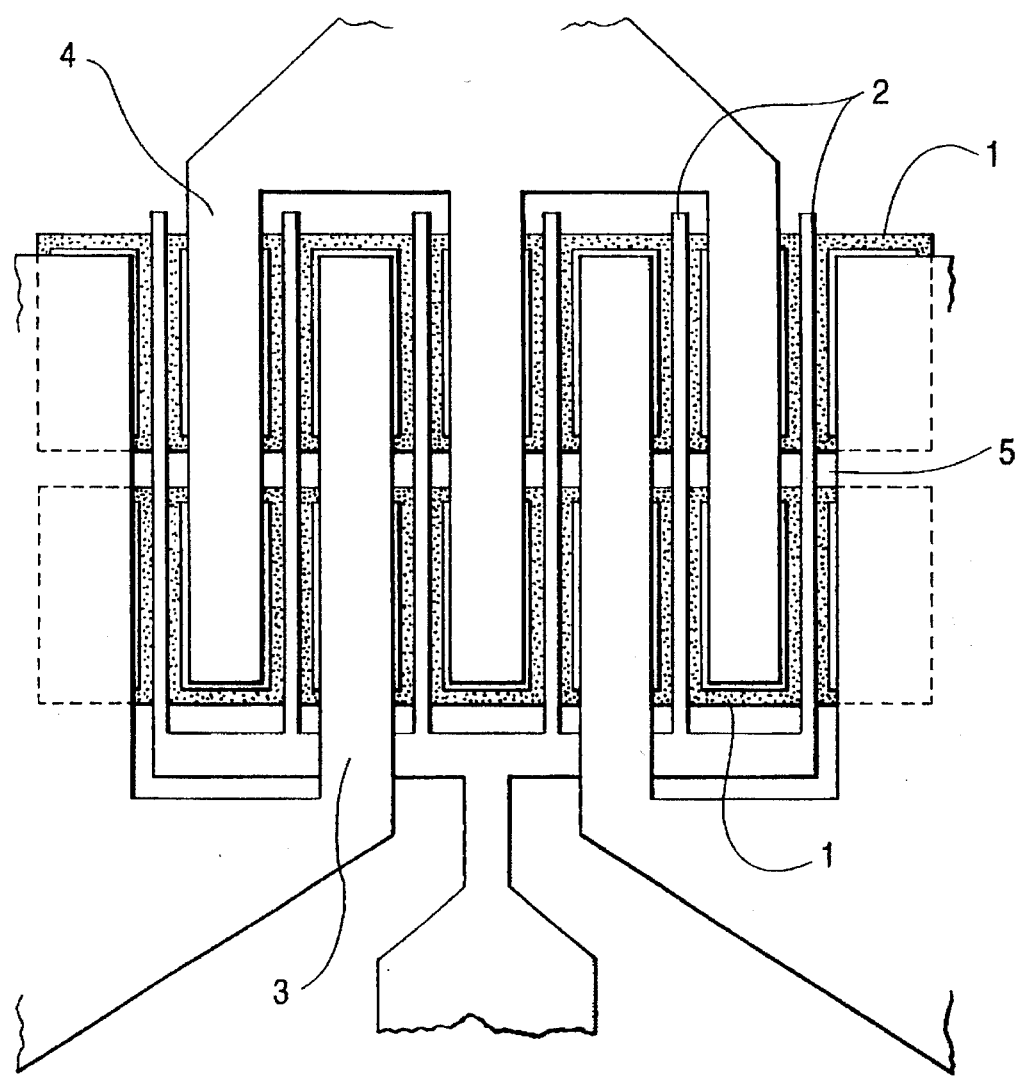
FIG. 3 is a plan view showing the first embodiment of a semiconductor device according to the present invention.

FIG. 3 is a plan view showing a semiconductor device according the first embodiment of the present invention, and FIGS. 4A to 4D are plan views showing the manufacturing steps, respectively.

Figure 4A:
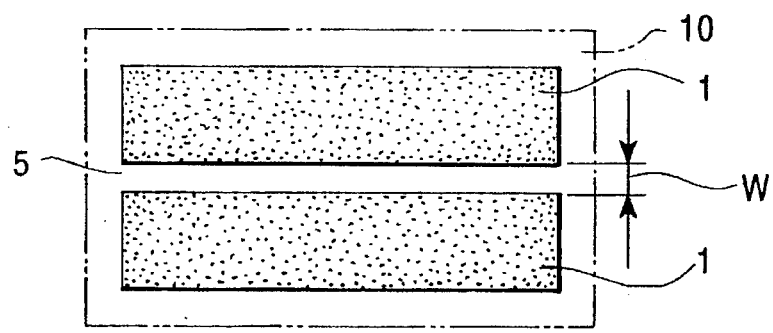
FIGS. 4A to 4D are plan views sequentially showing the steps of manufacturing the first embodiment of the present invention.

In FIG. 4A, an n-type GaAs layer having an impurity concentration of $2 \times 10^{17}$ cm$^{-3}$ and a thickness of 0.3 μm is formed on a semi-insulating GaAs substrate 10 by an MBE method. This GaAs layer is patterned using a photoresist.

Oxygen or boron ions are selectively implanted in an area except for an active layer to form an isolation area 5. At this time, the isolation area 5 is formed to divide an active layer area 1.

The photoresist pattern is adjusted such that a width W of the isolation area 5 becomes twice the GaAs thickness (in general, 20 to 50 μm) in a chip form.

Figure 4B:
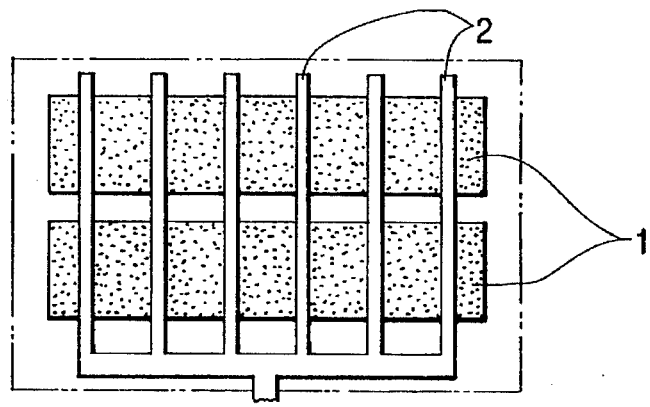

Next, in FIG. 4B, a photoresist film is applied on an insulating film which is deposited to a thickness of 300 to 400 nm and consists of, e.g., SiO$_2$. Then, the photoresist film is patterned. On the resultant structure, e.g., an aluminum film is vapor-deposited to a thickness of 500 nm to form gate electrodes 2 by a lift-off method.

Figure 4C:
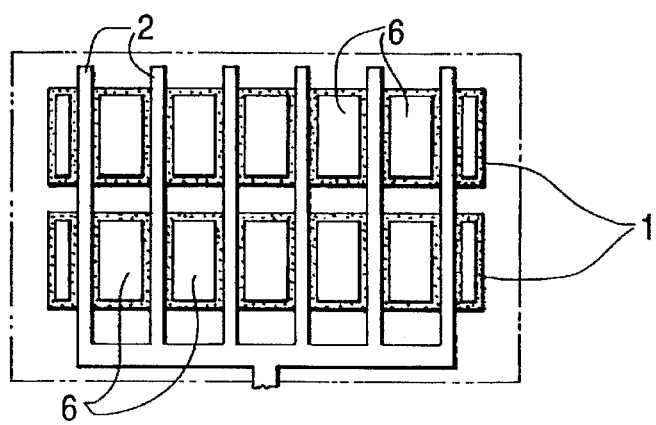

As shown in FIG. 4C, a pattern is formed at source and drain electrode portions by using a photoresist film. AuGe/Ni is vapor-deposited to form ohmic electrodes 6 by a lift-off method.

Figure 4D:
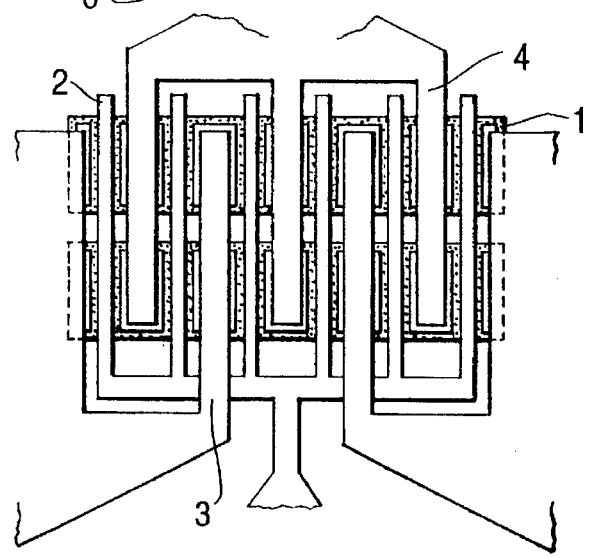

Further, as shown in FIG. 4D, source electrodes 3 and drain electrodes 4 are formed. Then, Au-plated wiring metal layers are formed on the respective electrodes to complete a field effect transistor.

By the above steps, the structure shown in FIG. 3 can be obtained in which the isolation area 5 is formed in the active layer area 1, and the gate electrodes 2, the source electrodes 3, and the drain electrodes 4 are alternately arranged in parallel with one another.

With this structure, heat generated in the element diffuses into the isolation area 5 arranged in the active layer area 1, thereby reducing the thermal resistance Rθ.

Figure 5:
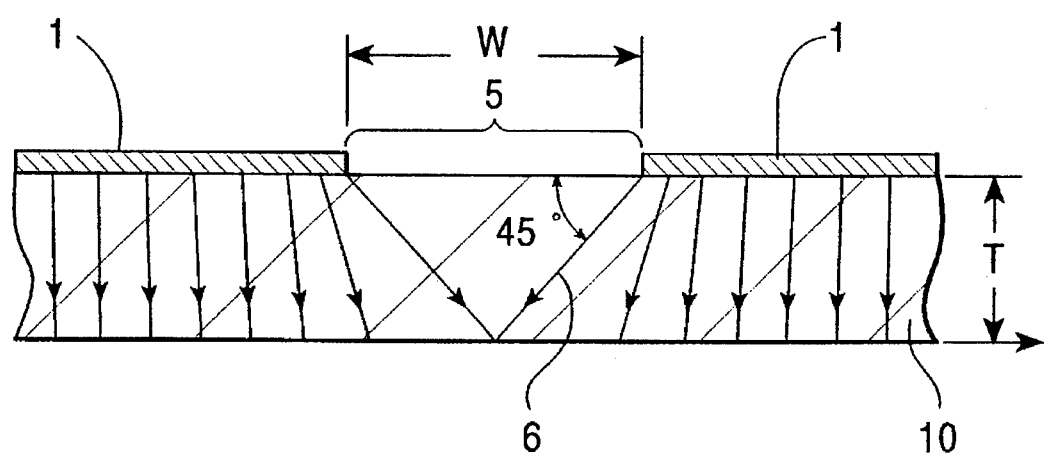
FIG. 5 is a sectional view for explaining heat diffusion in an element.

FIG. 5 is a sectional view showing heat diffusion in the element. Heat flows 6 are indicated by arrows in the GaAs substrate 10 within the active layer area 1 and the isolation area 5.

Assuming that heat diffuses in the direction of 45° as shown in FIG. 5, the width W of the isolation area must be at least twice a thickness T of the GaAs substrate.

More specifically, it is preferable that the width W of the isolation area 5 be almost twice the thickness T (in general, 20 to 50 μm) of the GaAs substrate 10 of the chip. Note that the finger length becomes too large if the width W is set to be too large, and the thermal resistance Rθ becomes high if the width W is set to be too small. From this viewpoint, the width W is preferably almost twice the thickness T of the GaAs substrate 10.

Figure 6:
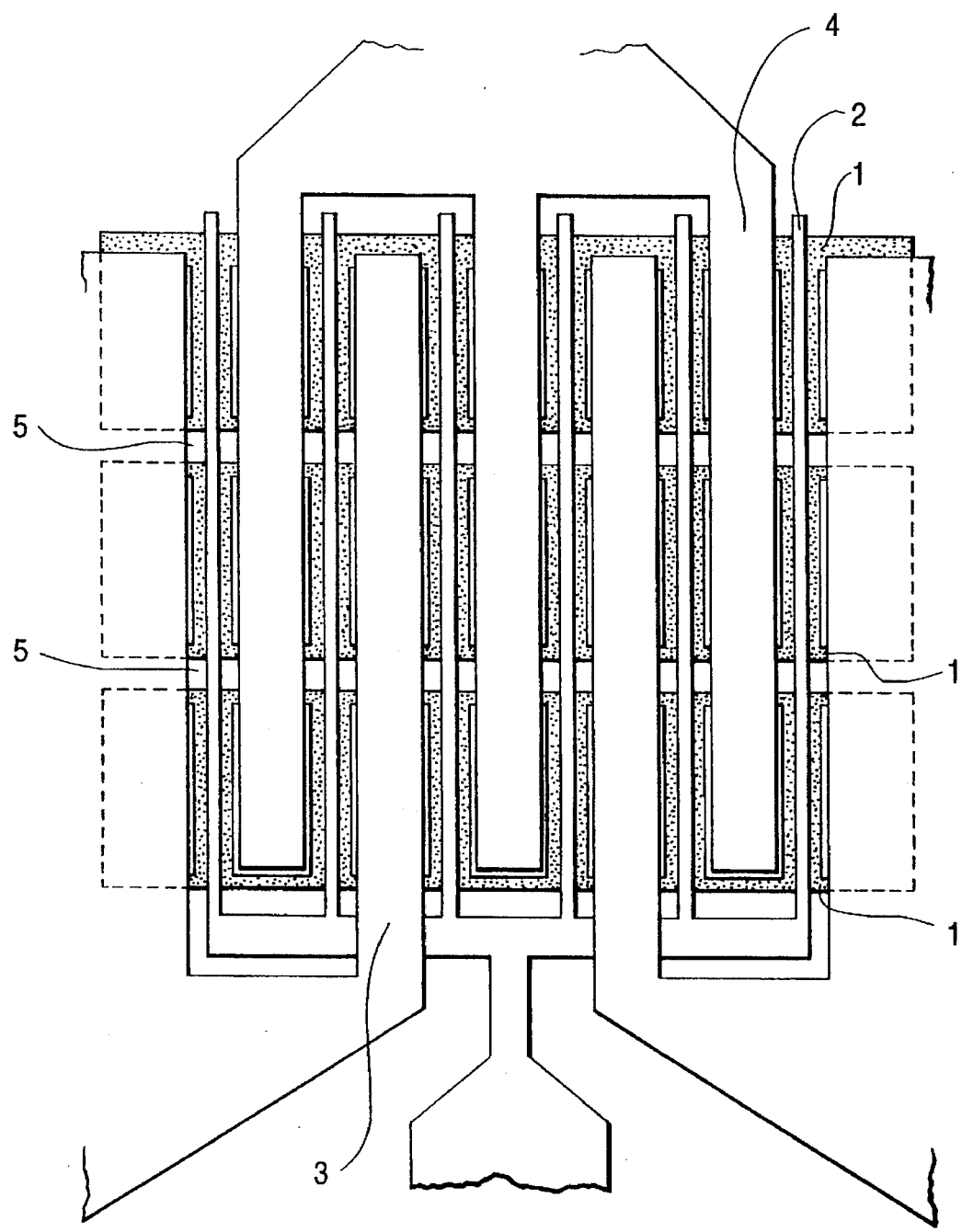
FIG. 6 is a plan view showing the second embodiment of a semiconductor device according to the present invention.

FIG. 6 shows the second embodiment of the present invention.

FIG. 6 shows a structure in which isolation areas 5 are formed in an active layer area 1, and pluralities of gate electrodes 2, source electrodes 3, and drain electrodes 4 are alternately arranged parallel to each other. The isolation areas 5 are formed at two portions in the active layer area 1.

Similarly, the thermal resistance Rθ can be further reduced by arranging isolation areas 5 at a plurality of portions.

Figure 7:
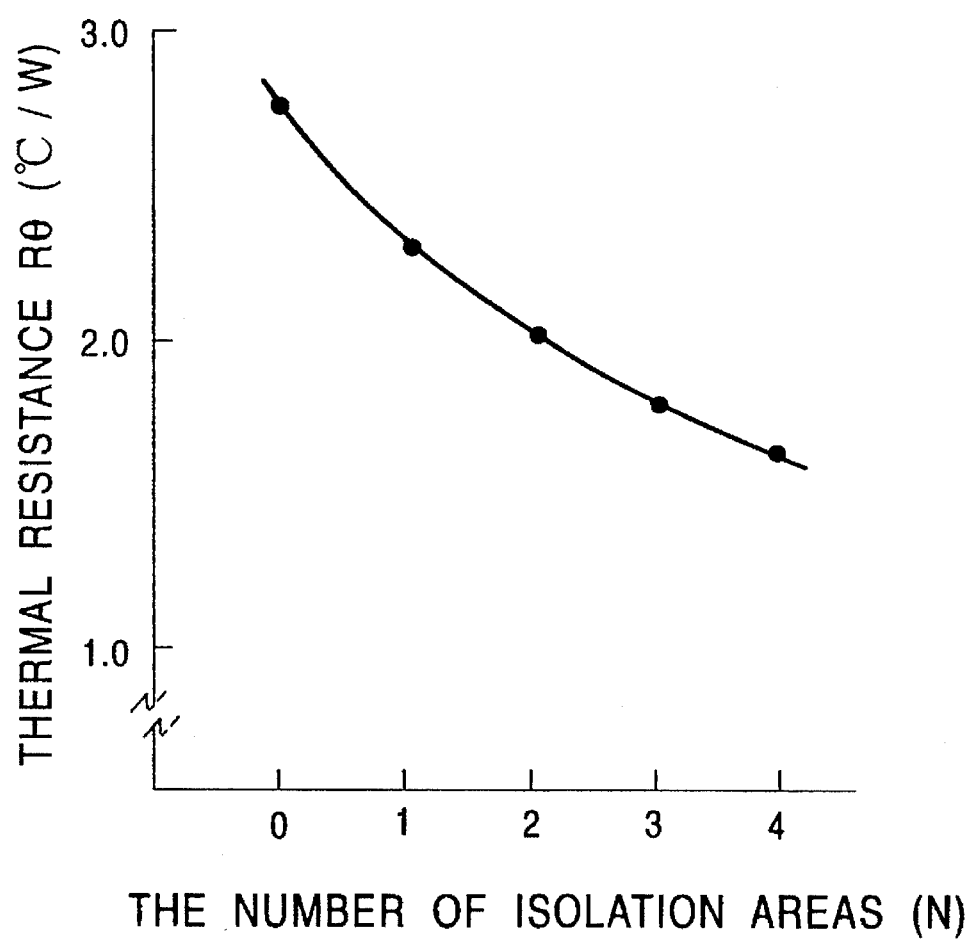
FIG. 7 is a graph showing the relationship between the number of isolation areas and the thermal resistance.

FIG. 7 shows the relationship between the number N of N isolation areas and the thermal resistance Rθ. The number N of isolation areas is plotted along the abscissa, and the thermal resistance Rθ(°C./W) is plotted along the ordinate.

As shown in FIG. 7, for a given gate width, the thermal resistance Rθ is reduced with an increase in number N of isolation areas. Accordingly, an increase in channel temperature can be suppressed. Note that, in FIG. 7, the gate width is 28.8 mm, and the number of fingers is 96.

What we claimed is:

1. A semiconductor device comprising a structure including pluralities of gate electrodes, drain electrodes, and source electrodes, each of said electrodes extending parallel to the others of said electrodes, said device also comprising at least one isolation area formed in a direction perpendicular to at least one gate electrode so as to separate one active layer area formed on a semiconductor substrate into a plurality of separate active layer areas, said at least one gate electrode being connected to each of said separate active layer areas.

2. A device according to claim 1, wherein said isolation area is formed at, at least one portion between one and the other terminals of each electrode.

3. A device according to claim 2, wherein said isolation area has a width approximately twice thickness of said semiconductor substrate.

4. A device according to claim 2, wherein said isolation area is formed at a plurality of portions between said one and other terminals of each electrode.

5. A device according to claim 1, wherein said at least one isolation area comprises a plurality of isolation areas for separating said one active layer area into respective pluralities of active layer areas, each of said gate electrodes being connected to a respective plurality of active layer areas.

6. A device according to claim 5, wherein said isolation areas extend perpendicular to said gate electrodes.

7. A device according to claim 1, wherein said structure comprises a comb-shaped gate structure.

8. A device according to claim 7, wherein a plurality of field effect transistors are aligned parallel to each other in said comb-shaped gate structure.

9. A device according to claim 1, wherein each of said gate electrodes is connected to two active layer areas.

* * * * *